United States Patent
Chen et al.

(10) Patent No.: US 11,721,609 B2
(45) Date of Patent: Aug. 8, 2023

(54) THROUGH SILICON CONTACT STRUCTURE AND METHOD OF FORMING THE SAME

(71) Applicant: Yangtze Memory Technologies Co., Ltd., Hubei (CN)

(72) Inventors: Liang Chen, Wuhan (CN); Wei Liu, Wuhan (CN); Shao-Fu Sanford Chu, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 32 days.

(21) Appl. No.: 17/347,086

(22) Filed: Jun. 14, 2021

(65) Prior Publication Data

US 2021/0313251 A1 Oct. 7, 2021

Related U.S. Application Data

(60) Division of application No. 16/365,728, filed on Mar. 27, 2019, now Pat. No. 11,069,596, which is a
(Continued)

(51) Int. Cl.
*H01L 23/48* (2006.01)
*H01L 21/762* (2006.01)
(Continued)

(52) U.S. Cl.
CPC ...... *H01L 23/481* (2013.01); *H01L 21/76224* (2013.01); *H01L 21/76831* (2013.01); *H01L 21/76898* (2013.01); *H01L 23/535* (2013.01)

(58) Field of Classification Search
CPC ....... H01L 2924/1434; H01L 21/76898; H01L 23/481; H01L 2225/06544;
(Continued)

(56) References Cited

U.S. PATENT DOCUMENTS 8,513,767 B2 8/2013 Kotlanka et al.
9,048,354 B2 6/2015 Park et al.
(Continued)

FOREIGN PATENT DOCUMENTS

CN 102693936 A 9/2012
CN 102760710 A 10/2012
(Continued)

OTHER PUBLICATIONS

Japanese Office Action dated Oct. 3, 2022 in Japanese Patent Application No. 2021-548148, 4 pages.
(Continued)

*Primary Examiner* — Alia Sabur
(74) *Attorney, Agent, or Firm* — Oblon, McClelland, Maier & Neustadt, L.L.P.

(57) ABSTRACT

In a method for forming an integrated structure, a top dielectric layer is formed over a top surface of a substrate. The top dielectric layer includes a plurality of vias that are formed through the top dielectric layer and extend into the substrate. A bottom dielectric layer is formed on a bottom surface of the substrate. An isolation opening and a plurality of contact openings are further formed in the bottom dielectric layer and the substrate, where the isolation opening passes through the bottom dielectric layer and extends from the bottom surface to the top surface of the substrate. The isolation opening is filled with an insulating layer to form an isolation trench. The plurality of contact openings are filled with a conductive layer to form a plurality of through silicon contacts (TSCs). A conductive plate is further formed over the bottom dielectric layer.

20 Claims, 12 Drawing Sheets

Related U.S. Application Data continuation of application No. PCT/CN2019/075400, filed on Feb. 18, 2019.

(51) Int. Cl.
*H01L 21/768* (2006.01)
*H01L 23/535* (2006.01)

(58) Field of Classification Search
CPC ......... H01L 27/11575; H01L 27/11286; H01L 27/11573
See application file for complete search history.

(56) References Cited

U.S. PATENT DOCUMENTS

| | | |
|---|---|---|
| 9,608,026 B2 | 3/2017 | Park et al. |
| 9,881,929 B1 | 1/2018 | Ravikirthi et al. |
| 10,008,570 B2 | 6/2018 | Yu et al. |
| 2009/0051012 A1 | 2/2009 | Maebashi |
| 2009/0061659 A1 | 3/2009 | Maebashi |
| 2010/0230773 A1 | 9/2010 | Nakazawa et al. |
| 2012/0241901 A1 | 9/2012 | Kotlanka et al. |
| 2012/0313211 A1 | 12/2012 | Nakazawa et al. |
| 2012/0329277 A1 | 12/2012 | Zhu |
| 2013/0323875 A1 | 12/2013 | Park et al. |
| 2015/0262914 A1 | 9/2015 | Akou et al. |
| 2015/0263060 A1 | 9/2015 | Park et al. |
| 2016/0141226 A1 | 5/2016 | Leobandung |
| 2016/0329304 A1 | 11/2016 | Hatakeyama et al. |
| 2016/0365352 A1 | 12/2016 | Nishikawa et al. |
| 2018/0068928 A1 | 3/2018 | Akou et al. |
| 2018/0166381 A1 | 6/2018 | Safran |
| 2019/0067105 A1 | 2/2019 | Zhu et al. |

FOREIGN PATENT DOCUMENTS

| | | |
|---|---|---|
| CN | 105914217 A | 8/2016 |
| CN | 106920797 A | 7/2017 |
| CN | 107068687 A | 8/2017 |
| CN | 107644837 A | 1/2018 |
| CN | 107644837 A | 1/2018 |
| CN | 109300903 A | 2/2019 |
| EP | 2 228 826 A2 | 9/2010 |
| JP | 2006-19455 A | 1/2006 |
| JP | 2009-295719 A | 12/2009 |
| JP | 2011-243656 A | 12/2011 |
| JP | 2013-118264 A | 6/2013 |
| JP | 2014-41879 A | 3/2014 |
| KR | 10-2014-0029178 A | 3/2014 |
| KR | 10-2015-0123693 A | 11/2015 |
| KR | 10-2017-0014757 A | 2/2017 |
| KR | 10-2017-0083948 A | 7/2017 |
| TW | 200536095 A | 11/2005 |
| TW | 201349443 A | 12/2013 |
| TW | 201503295 A | 1/2015 |

OTHER PUBLICATIONS

Korean Office Action dated Oct. 10, 2022 in Korean Patent Application No. 10-2021-7026531, 6 pages.
Combined Office Action and Search Report dated Oct. 14, 2019 in Chinese Patent Application No. 201980000367.4, 7 pages (with English translation of categories of cited documents).
Office Action dated Jan. 13, 2020 in Chinese Patent Application No. 201980000367.4 (with English translation of categories of cited references).
International Search Report and Written Opinion dated Nov. 18, 2019 in PCT/CN2019/075400, 9 pages.
Extended European Search Report dated Jul. 15, 2022 European Patent Application No. 19915776.9, 9 pages.
Office Action dated Apr. 27, 2023, in Korean Patent Application No. 10-2021-7038759, 3 pages.
Office Action dated May 11, 2023, in European Patent Application No. 20 913 057.4, 6 pages.
Office Action dated Apr. 27, 2023, in Korean Patent Application No. 10-2021-7015031, 4 pages.

THROUGH SILICON CONTACT STRUCTURE AND METHOD OF FORMING THE SAME

RELATED APPLICATION

This application is a divisional of U.S. patent application Ser. No. 16/365,728 filed on Mar. 27, 2019, which is a continuation of International Application No. PCT/CN2019/075400, filed on Feb. 18, 2019. The entire contents of the above-identified applications are incorporated herein by reference in their entireties.

BACKGROUND

A through silicon contact (TSC) is widely used in semiconductor industry. The TSC is a vertical electrical connection passing completely through a silicon wafer or a die. TSC technology is important in creating 3D packages and 3D integrated circuits. The TSC provides interconnection of vertically aligned electronic devices through internal wiring that significantly reduces complexity and overall dimensions of a multi-chip electronic circuit. Compared to traditional packaging technologies, the TSC technology provides higher interconnect and device density, shorter length of the connection.

A related TSC structure includes a TSC opening passing through a substrate, a barrier layer formed along sidewalls of the TSC opening, and a conductive material filled in the TSC opening. As the critical dimensions of semiconductor devices in integrated circuits shrink to achieve higher device density and faster operation speed, an RC delay introduced by the related TSC structure becomes a major concern.

SUMMARY

The inventive concepts relate to a novel TSC structure with a plurality of through silicon contacts (TSCs) passing through a substrate. The TSC structure introduces one or more vias that are electrically coupled with the plurality of TSCs and the substrate to reduce/eliminate the electric potential difference between the TSCs and the substrate. The reduced/eliminated electric potential difference in turn reduces or eliminates parasitic capacitance formed between the TSCs and the substrate. In addition, an isolation trench is introduced into the TSC structure that separates the TSC structure from adjacent electronic components to prevent the electrical interference between the TSC structure and the adjacent electronic components.

Through silicon contact (TSC) technology is widely used in semiconductor memory industry. For example, as 3D NAND technology migrates towards high density and high capacity, especially from 64 L to 128 L architecture, the number of devices, the number of metal lines has increased significantly, especially the periphery circuits. The increased periphery circuits require a larger chip area that lowers NAND bit density. One of the solutions is to produce an array circuit wafer that includes memory cells and a periphery circuit wafer that includes control circuits respectively. A through silicon contact (TSC) structure can be subsequently introduced to electrically connect the array circuit wafer and the periphery circuit wafer. However, related TSC structure is found to have RC delay issue due to the parasitic capacitance of TSC structure. Therefore, a new TSC structure is needed to meet the advanced technology requirements.

In the disclosure, a novel TSC structure is introduced. According to an aspect of the disclosure, an integrated circuit chip is provided. The integrated chip includes a substrate that has opposing first and second main surfaces, a plurality of transistors that are formed at a first location of the substrate in the second main surface, and a bond pad structure that is formed at a second location of the substrate. The bond pad structure include a first dielectric layer that is formed over the first main surface of the substrate, a through silicon contact (TSC) that is formed in the first dielectric layer and the substrate so that the TSC extends through the first dielectric layer and extends into the substrate. The bond pad structure further includes a conductive plate that is formed over the first dielectric layer and electrically coupled with the TSC. The bond pad structure has an isolation trench that is formed in the first dielectric layer and the substrate. The isolation trench concentrically surrounds the conductive plate and extends through the first dielectric layer and the first and second main surfaces of the substrate. The isolation trench and the conductive plate are spaced apart from each other by the first dielectric layer. The bond pad structure further has a second dielectric layer formed on the second main surface of the substrate. A first via is formed in the second dielectric layer that extends through the second main layer into the substrate and is connected to the TSC. A second via formed in the second dielectric layer that extends through the second main layer into the substrate and is not connected to the TSC.

In some embodiments, the bond pad structure further includes a metal line that is formed over the second dielectric layer, and the metal line is connected to the first via and the second via.

In some embodiments, the TSC further includes a contact region that is formed in the first dielectric layer and the substrate. The contact region has side portions and a bottom portion to expose the first via. A barrier layer is formed along the side portions of the contact region, and a conductive layer is formed along the barrier layer. The conductive layer is disposed in the contact region and connected with the first via.

In some embodiments, the through silicon contact (TSC) is formed in the first dielectric layer and the substrate so that the TSC extends through the first dielectric layer and the first and second main surfaces of the substrate.

According to another aspect of the disclosure, a method for manufacturing the bond pad structure is provided. In the disclosed method, a top dielectric layer is formed over a top surface of a substrate. The substrate has opposing first and second main surfaces, and a plurality of vias are formed in the top dielectric layer and extend into the substrate. The plurality of vias are electrically coupled to one another. A bottom dielectric layer is formed on a bottom surface of the substrate. An isolation opening and a plurality of contact openings are subsequently formed in the bottom dielectric layer and the substrate. The isolation opening passes through the bottom dielectric layer and extends from the bottom surface to the top surface of the substrate. Each of the plurality of contact openings has side portions and a bottom portion to expose a respective via that is formed in the top dielectric layer. The isolation opening is then filled with an insulating layer to form an isolation trench. The plurality of contact openings is further filled with a conductive layer to form a plurality of through silicon contacts (TSCs). The conductive layer is in direct contact with the respective via that is exposed by the each of the plurality of contact openings. A conductive plate is formed over the bottom dielectric layer. The conductive plate is in direct contact with the plurality of through silicon contacts. The conductive plate is further concentrically surrounded by the isolation trench and spaced apart from the isolation trench by the bottom dielectric layer.

In some embodiments, in the disclosed method, forming the bottom dielectric layer on the bottom surface of the substrate further includes removing a bottom portion of the substrate from the bottom surface and forming the bottom dielectric layer on the bottom surface of the substrate.

According to yet another aspect of the disclosure, a semiconductor device is provided. The semiconductor device includes a substrate that has opposing top and bottom surfaces. A memory cell region is formed in the top surface of the substrate, and a through silicon contact (TSC) structure is formed adjacent to the memory cell region. The TSC structure includes a bottom dielectric layer that is formed over the bottom surface of the substrate, a through silicon contact (TSC) that is formed within the bottom dielectric layer and the substrate. The TSC passes through the bottom dielectric layer and extends into the substrate. The TSC structure also includes a bond plate that is formed over the bottom dielectric layer, and the bond plate is electrically connected with the TSC. The TSC structure further includes an isolation trench formed in the bottom dielectric layer and the substrate. The isolation trench concentrically surrounds the bond plate, passes through the bottom dielectric layer, and extends from the top surface to the bottom surface of the substrate. The isolation trench and the bond plate are separated by the bottom dielectric layer. In the TSC structure, a top dielectric layer is formed on the top surface of the substrate, a first via is formed in the top dielectric layer that extends through the top surface into the substrate and is connected to the TSC, and a second via is formed in the top dielectric layer. The second via extends through the top surface into the substrate and is not connected with the TSC.

In some embodiments, the memory cell region can include a plurality of DRAM memory cells, a plurality of NAND memory cells, a plurality of three dimensional NAND memory cells, a plurality of phase change memory cells, or a plurality of magnetoresistive random-access memory (MRAM) cells.

According to the disclosure, a novel through silicon contact (TSC) structure is provided. The TSC structure includes a bottom dielectric layer formed over a bottom surface of a substrate, a top dielectric layer formed over a top surface of the substrate, a plurality of through silicon contacts (TSCs) passing through the bottom dielectric layer and extending into the substrate, and a plurality of vias that are formed in the top dielectric layer and extend through the top surface into the substrate. The TSCs are electrically connected to a conductive pad, and the vias are electrically connected to a metal line and electrically coupled with one another. In the disclosed TSC structure, a first plurality of the vias is connected to the TSCs and a second plurality of the vias is electrically coupled with the substrate and not connected to any of the TSCs. Therefore, the disclosed TSC structure herein introduces one or more vias (e.g., the second plurality of the vias) that are electrically coupled with the plurality of TSCs and the substrate to reduce/eliminate the electric potential difference between the TSCs and the substrate. The reduced/eliminated electric potential difference in turn reduces or eliminates parasitic capacitance formed between the TSCs and the substrate. In addition, an isolation trench is introduced into the TSC structure that separates the TSC structure from adjacent electronic components to prevent the electrical interference between the TSC structure and the adjacent electronic components.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
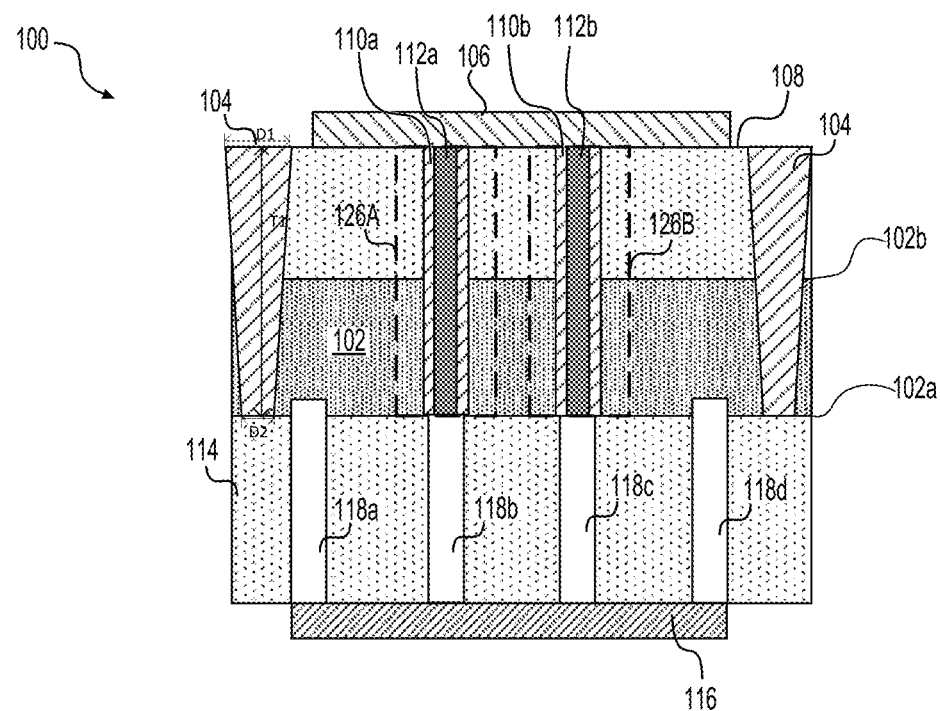
FIG. 1A is a cross-sectional view of a through silicon contact (TSC) structure, in accordance with exemplary embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed features may be in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
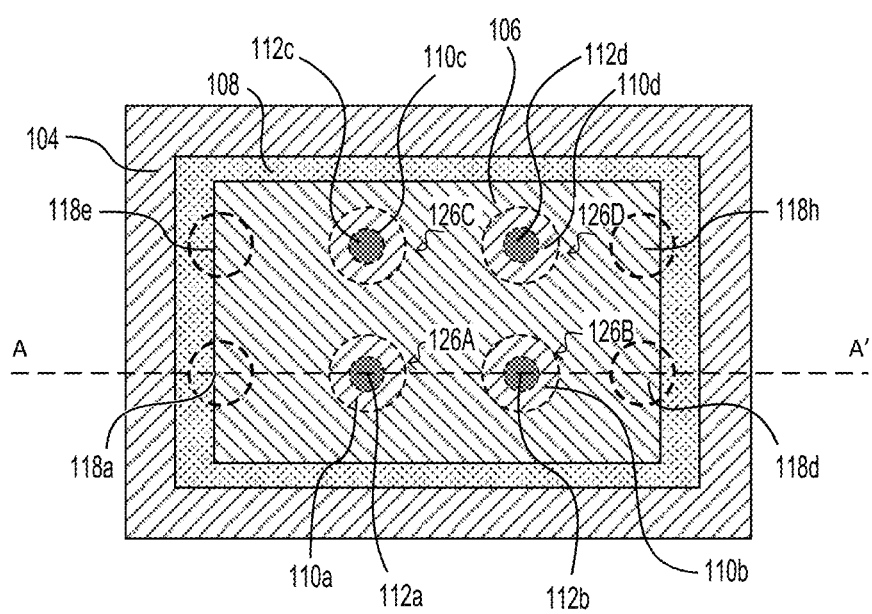
FIG. 1B is a top down view of the TSC structure, in accordance with exemplary embodiments of the disclosure.

FIG. 1A is a cross-sectional view of a through silicon contact (TSC) structure 100, and FIG. 1B is a top down view of the TSC structure 100 where the cross-sectional view of the TSC structure 100 in FIG. 1A is obtained from a plane same as the vertical plane containing line A-A' in FIG. 1B. Dashed lines in FIG. 1B indicate a perspective view.

The TSC structure 100 can have a substrate 102. The substrate 102 has a bottom surface (or first main surface) 102b and a top surface (or second main surface) 102a. The TSC structure 100 can have a bottom dielectric layer 108 formed on the bottom surface 102b. In an embodiment, the bottom dielectric layer 108 can be made of SiO, SiN, SiC, SiON, SiOC, SiCN, SiOCN, AlO, AlON, ZrO, or high K material. The bottom dielectric layer 108 can have a thickness in a range from 1 um to 2 um.

A plurality of through silicon contacts 126 (TSCs) are formed in the bottom dielectric layer 108 and the substrate 102. For example, four TSCs 126A-126D are included in FIGS. 1A/1B. However, four TSCs are shown as an example, and the invention is not limited to this number. The TSCs 126 pass through the bottom dielectric layer 108 and extend through the bottom surface 102b into the substrate 102. In some embodiments, the TSCs 126 pass through the bottom dielectric layer 108 and extend from the bottom surface 102b to the top surface 102a of the substrate 102.

The TSCs can have a circular pillar-shape with a critical dimension (CD) in a range from 300 nm to 400 nm and a height in a range from 3 um to 4 um. The disclosure is not limited thereto, and the TSC may be formed in a square pillar-shape, an oval pillar-shape, or other suitable shapes, depending on the design requirements.

Each of the TSCs has side portions and a bottom portion. A barrier layer is formed along the side portions of the TSC, and a conductive layer is formed along the barrier layer and surrounded by the barrier layer. For example, a TSC 126A has a barrier layer 110a formed along the side portion, and a conductive layer 112a that is formed along the barrier layer 110a and surrounded by the barrier layer 110a. The barrier layers 110a-110d can have a thickness in a range from 100 nm to 200 nm, and include Tetraethyl Orthosilicate (TEOS), SiO, SiN, SiC, SiON, SiOC, SiCN, SiOCN, or other suitable materials. The conductive layers 112a-112d can include copper, tungsten, cobalt, ruthenium, or other suitable conductive materials.

The TSC structure 100 further has a top dielectric layer 114 formed on the top surface 102a. A plurality of vias 118 are formed in the top dielectric layer 114. For example, eight vias 118a-118h are included in FIGS. 1A/1B. In the disclosed TSC structure 100, a first plurality of the vias 118 is connected with the TSCs 126, and a second plurality of the vias 118 extends into the substrate 102 from the top surface 102a to be electrically coupled with the substrate. For example, as shown in FIGS. 1A/1B, a bottom portion of the TSC 126A is in direct contact with a via 118b where the conductive layer 112a of the TSC 126A is electrically connected with the via 118b. Similarly, a TSC 126B is in direct contact with a via 118c, a TSC 126C is in direct contact with a via 118f (not shown), and a TSC 126D is in direct contact with a via 118g (not shown). It should be noted that the vias 118 and the TSCs 126 can have various diameters according to technology requirements. Still referring to FIGS. 1A/1B, four vias 118a, 118d, 118e, and 118h are not connected with any one of the TSCs 126 and are in direct contact with the substrate 102. The four vias 118a, 118d, 118e, and 118h further extend into the substrate with a depth from 10 nm to 20 nm and are electrically coupled with the substrate 102. In some embodiments, the vias (e.g., 118b, 118c, 118f and 118g) that are in direct contact with the TSCs 126 can have a same diameter as the vias (e.g., 118a, 118d, 118e, and 118h) that are in direct contact with the substrate. In some embodiments, the vias that are in direct contact with the TSCs 126 can have a different diameter from the vias that are in direct contact with the substrate.

The top dielectric layer 114 can have a thickness in a range from 5 um to 6 um, and can be made of SiO, SiN, SiC, SiON, SiOC, SiCN, SiOCN, AlO, AlON, ZrO, or high K material. The vias 118 can have a bottom CD that exposes the top surface 102a in a range from 120 nm to 160 nm, a top CD in a range from 250 nm to 300 nm, and a height between 4.5 um and 5 um. The vias 118 can include copper, tungsten, cobalt, ruthenium, or other suitable conductive materials.

In the TSC structure 100, a conductive plate 106 is formed over the bottom dielectric layer 108. The conductive plate 106 can have a rectangle profile, a square profile, or other geometric profile. The conductive plate 106 is connected with the TSCs 126 and functions as a bond pad during a packaging process. The conductive plate 106 can be made of aluminum or copper with a thickness in a range from 600 nm to 700 nm, and a minimum width of 600 nm. The TSC structure 100 also includes a metal line 116 that is connected with the vias 118. In some embodiments, the metal line 116 can be connected with four vias 118a-118d. In some embodiments, the metal line 116 can be connected with all eight vias 118a-118h as shown in FIGS. 1A/1B, depending on the circuit requirements. The metal line 116 can be made of copper, tungsten, or aluminum with a CD in a range from 200 nm to 300 nm, and a thickness in a range from 400 Å to 600 Å.

Still referring to FIGS. 1A/1B, an isolation trench 104 is formed in the bottom dielectric layer 108 and the substrate 102. The isolation trench 104 passes through the bottom dielectric layer 108 and the substrate 102. The isolation trench 104 further lands on the top dielectric layer 114. The isolation trench 104 is closed-shaped (such as ring-shaped) and concentrically surrounds the conductive plate 106. In other embodiments, the isolation trench 104 can be open-shaped (such as a ring with gaps). The conductive plate 106 and the isolation trench 104 are spaced apart by the bottom dielectric layer 108. The isolation trench 104 can have a top CD D1 in a range from 160 nm to 210 nm, a bottom CD D2 between 140 nm and 180 nm, and a height T1 between 3 um and 4 um.

The substrate 102 may include a silicon (Si) substrate, a germanium (Ge) substrate, a silicon germanium (SiGe) substrate, and/or a silicon-on-insulator (SOI) substrate. The substrate 102 may include a semiconductor material, for example, a Group IV semiconductor, a Group III-V compound semiconductor, or a Group II-VI oxide semiconductor. In an embodiment of FIG. 1, the substrate 102 is a Group IV semiconductor that may include Si, Ge, or SiGe. The substrate 102 may be a bulk wafer or an epitaxial layer.

Figure 2:
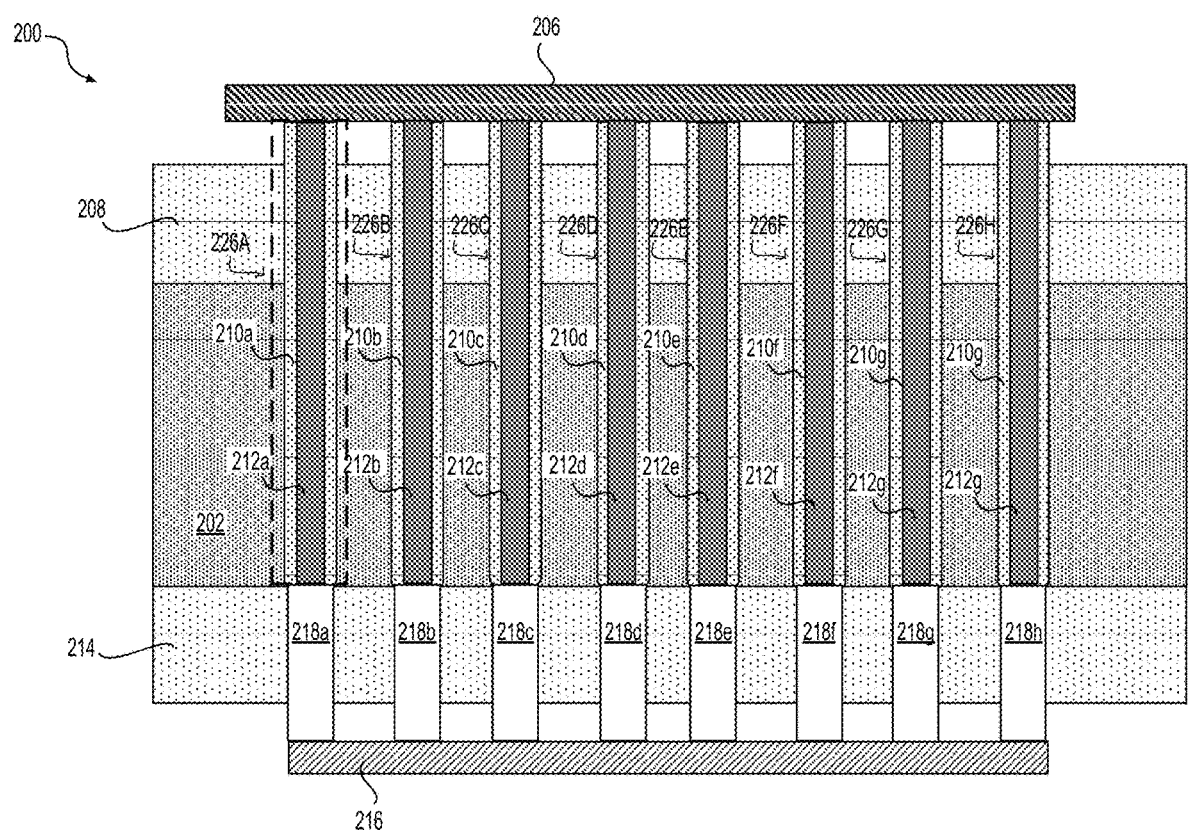
FIG. 2 is a cross-sectional view of a related through silicon contact (TSC) structure, in accordance with exemplary embodiments of the disclosure.

FIG. 2 is a cross-sectional view of a related through silicon contact (TSC) structure 200. The TSC structure 200 has a plurality of through silicon contacts (TSCs) 226, a conductive plate 206 that are connected with the TSCs 226, a plurality of vias 218 that are connected with the TSCs 226, and a metal line 216 that are connected with the vias 218. It should be noted that the vias 218 and the TSCs 226 can have various diameters according to technology requirements. Each of the TSCs 226 can have a barrier layer 210 and a conductive layer 212. Comparing to the TSC structure 100 as shown in FIG. 1, the TSC structure 200 does not include the isolation trench, and no additional vias are formed to be electrically coupled with a substrate 202. During the operation of the TSC structure 200, the substrate 202 and the conductive plate 206/TSCs 226 can have an electric potential difference. Parasitic capacitance can be formed between the substrate 202 and the conductive plate 206/TSCs 226 due to the electric potential difference. The formed parasitic capacitance in turns causes RC delay in operating an integrated circuit that is electrically coupled with the TSC structure 200.

On the contrary, in the TSC structure 100 as shown in FIGS. 1A/1B, the second plurality of vias (e.g., 118a, 118d, 118e, and 118h) is not connected with any of the TSCs 126 and is in direct contact with the substrate 102. The second plurality of vias further is electrically coupled with the TSCs 126 through the metal line 116 and the first plurality of vias (e.g., 118b, 118c, 118f, and 118g) that are connected with the TSCs 126. The substrate 102 and the TSCs 126 are therefore electrically coupled through the second plurality of vias 118. The electric potential difference between the substrate 102 and the TSCs 126 are accordingly reduced or eliminated, and the parasitic capacitance correspondingly becomes negligible. In addition, the isolation trench 104 further separates the TSC structure 100 from adjacent electronic components, such as memory cells, to prevent electrical interference.

FIGS. 3 through 10B illustrate the intermediate stages in the formation of a capacitor structure 100, where letter "A" indicates a cross-sectional view and "B" indicates a top down view. The cross-sectional view is obtained from a plane same as the vertical plane containing line A-A' in the top down view.

Figure 3:
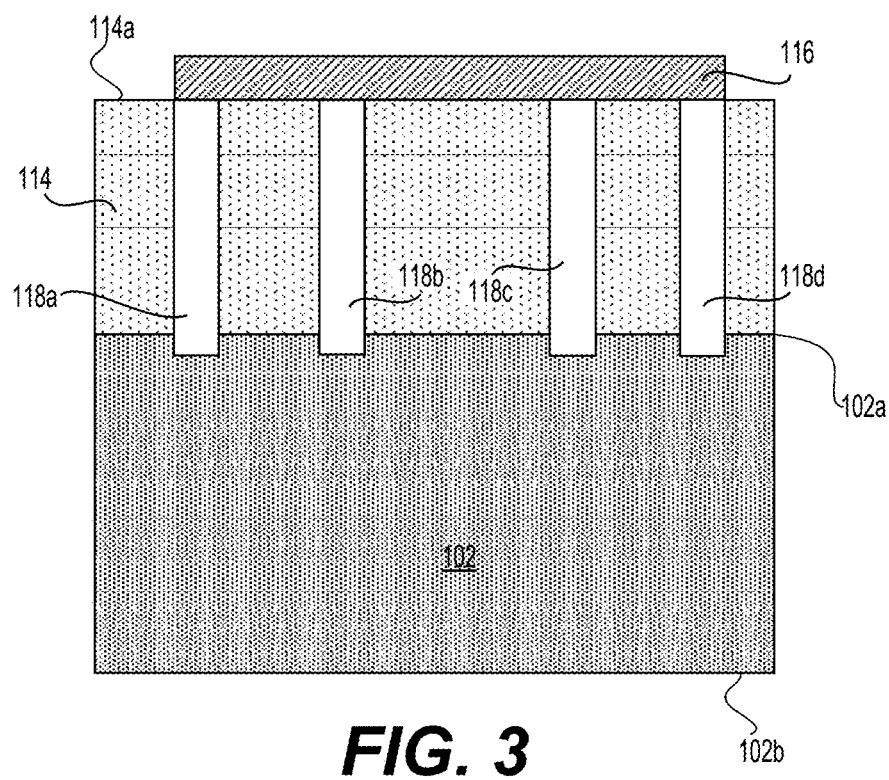
FIGS. 3 through 10B are cross-sectional and top down views of various intermediary steps of manufacturing a TSC structure, in accordance with exemplary embodiments of the disclosure.

As shown in FIG. 3, a substrate 102 is prepared. The substrate has a top surface 102a and a bottom surface 102b. A top dielectric layer 114 is formed on the top surface 102a of the substrate 102. The top dielectric layer 114 can have a thickness in a range from 5 um to 6 um, and can be made of SiO, SiN, SiC, SiON, SiOC, SiCN, SiOCN, AlO, AlON, ZrO, or high K material. Any suitable deposition process can be applied to form the top dielectric layer 114, such as chemical vapor deposition (CVD), physical vapor deposition (PVD), atomic layer deposition (ALD), diffusion, or any combination thereof.

Still referring to FIG. 3, a plurality of vias 118 are formed in the top dielectric layer 114. The vias 118 further extend into the substrate 102 with a depth between 10 nm and 20 nm. The vias 118 can be formed through a combination of a photolithographic process and an etching process. For example, a patterned mask stack can be formed over the top surface 114a of the top dielectric layer 114. A subsequent etching processing is introduced to etch through the top dielectric layer 114 to form a plurality of via openings. The via openings then can be filled with a conductive material, such as copper, tungsten, or aluminum. Various techniques can be applied to fill the via openings, such as PVD, CVD, ALD, or electro-chemical plating. In some embodiments, a blocking layer (not shown in FIG. 3), such as Ti, TiN, Ta, TaN, or other suitable materials, is formed before the conductive material. The blocking layer can be formed by applying a PVD deposition, a CVD deposition, an ALD deposition, or other well-known deposition techniques. The conductive material may also cover the top surface 114a of the top dielectric layer 114. A surface planarization process can be performed to remove the excessive conductive material over the top surface 114a of the top dielectric layer 114, and the remaining conductive material in the via openings forms the vias 118.

Over the top surface 114a of the top dielectric layer 114, a metal line 116 can be formed. The metal line 116 is connected with the vias 118. The metal line 116 can be made of copper, tungsten, or aluminum with a CD in a range from 200 nm to 300 nm, and a thickness in a range from 400 Å to 600 Å. The metal line 116 can be deposited by a suitable deposition process, such as chemical vapor deposition (CVD), physical vapor deposition (PVD), atomic layer deposition (ALD), sputtering, e-beam evaporation, or any combination thereof. Alternatively, the metal line 116 can be formed through a damascene technique and an electro-chemical plating (ECP) process may be applied.

Figure 4:
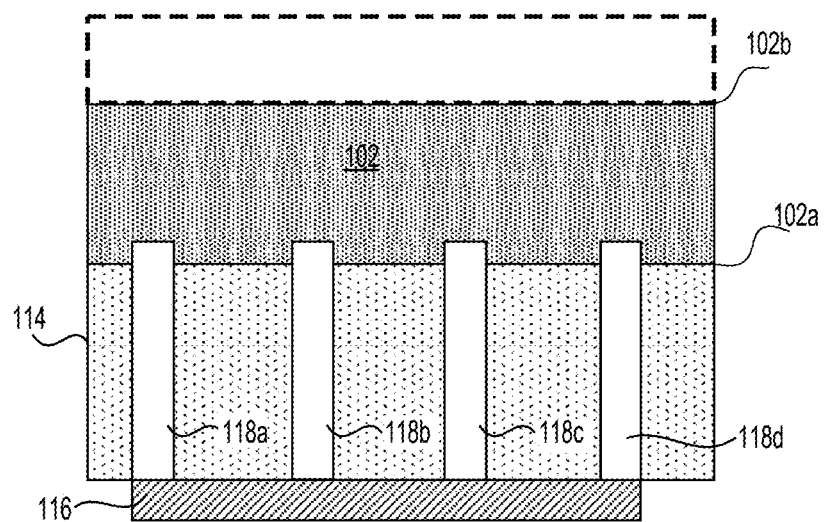

In FIG. 4, a thinning process is introduced to remove a bottom portion of the substrate 102 from the bottom surface 102b. Prior to the thinning process, a flipping process can be introduced where the substrate 102 is flipped upside down and the bottom surface 102b is exposed for the subsequent thinning process. Any suitable process can be applied to thin down the substrate 102, such as chemical mechanical polishing (CMP), etching back, or any combination thereof. After the thinning process, the substrate 102 can have a thickness in a range from 2 um to 3 um.

Figure 5:
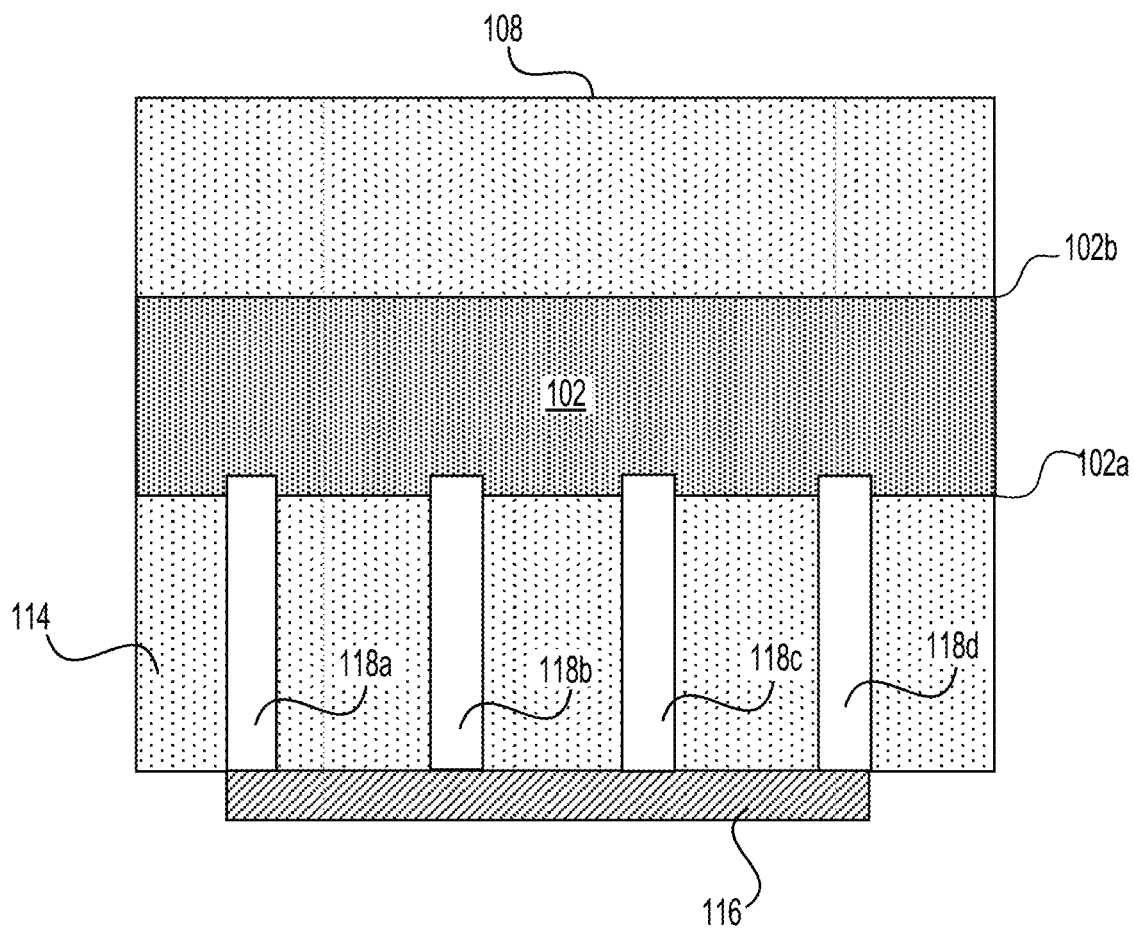

In FIG. 5, a bottom dielectric layer 108 is formed on the bottom surface 102b of the substrate. The bottom dielectric layer 108 can be made of SiO, SiN, SiC, SiON, SiOC, SiCN, SiOCN, AlO, AlON, ZrO, or high K material. The bottom dielectric layer 108 can have a thickness in a range from 1 um to 2 um. The bottom dielectric layer 108 can be deposited by a suitable deposition process, such as chemical vapor deposition (CVD), physical vapor deposition (PVD), atomic layer deposition (ALD), sputtering, e-beam evaporation, or any combination thereof.

Figure 6A:
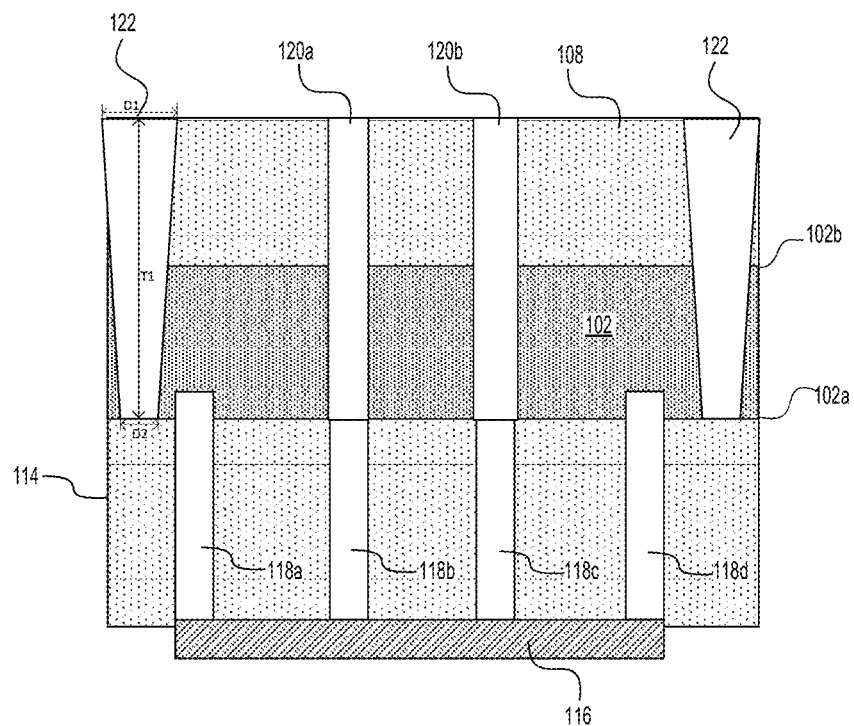

In FIGS. 6A/6B, a trench opening 122 and a plurality of through silicon contact (TSC) openings 120a-120d are formed. In order to form the trench opening 122 and the TSC openings 120, a patterned mask stack (not shown) can be formed on the bottom dielectric layer 108. The mask stack can include one or more hard mask layers and a photoresist layer. The mask stack can be patterned according to any suitable technique, such as a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), and the like.

Figure 6B:
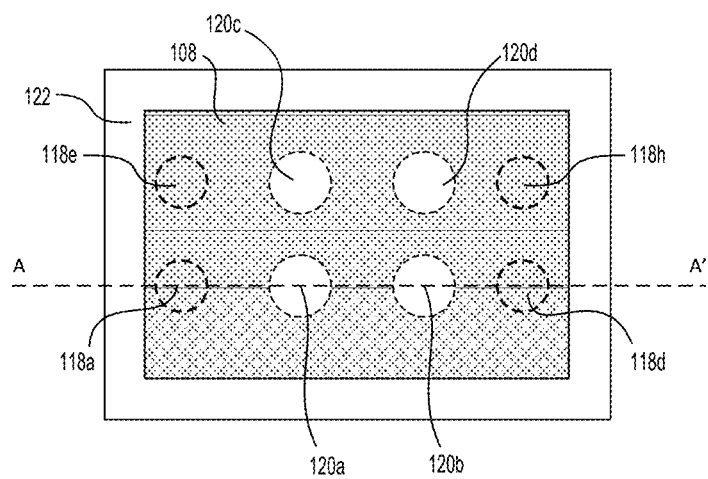

When the patterned mask stack is formed, an etching process, such as a wet etching or a dry etching, can be applied. The etching process etches through the bottom dielectric layer 108 and the substrate 102. The etching process transfers the patterns of the mask stack into the bottom dielectric layer 108 and the substrate 102. Portions of the bottom dielectric layer 108 and the substrate 102 that are exposed by the patterned mask stack are removed to form the trench opening 122 and the TSC openings 120. The trench opening 122 exposes the top dielectric layer 114. The trench opening 122 can have a top CD D1 in a range from 160 nm to 210 nm, a bottom CD D2 between 140 nm and 180 nm, and a height T1 from 3 um to 4 um. The trench opening 122 are ring-shaped and concentrically surrounds the TSC openings 120. The TSC openings 120 can have a circular pillar-shape with a CD in a range from 300 nm to 400 nm and a height in a range from 3 um to 4 um. Each of the TSC openings 120 has side portions and a bottom portion that exposes a respective via 118. For example, a TSC opening 120a can expose the via 118b, as shown in FIG. 6B. In some embodiments, the etching process can remove a portion of the vias 118 that extends into the substrate 102, and the TSC openings can therefore extend from the bottom surface 102b to the top surface 102a of the substrate.

Figure 7:
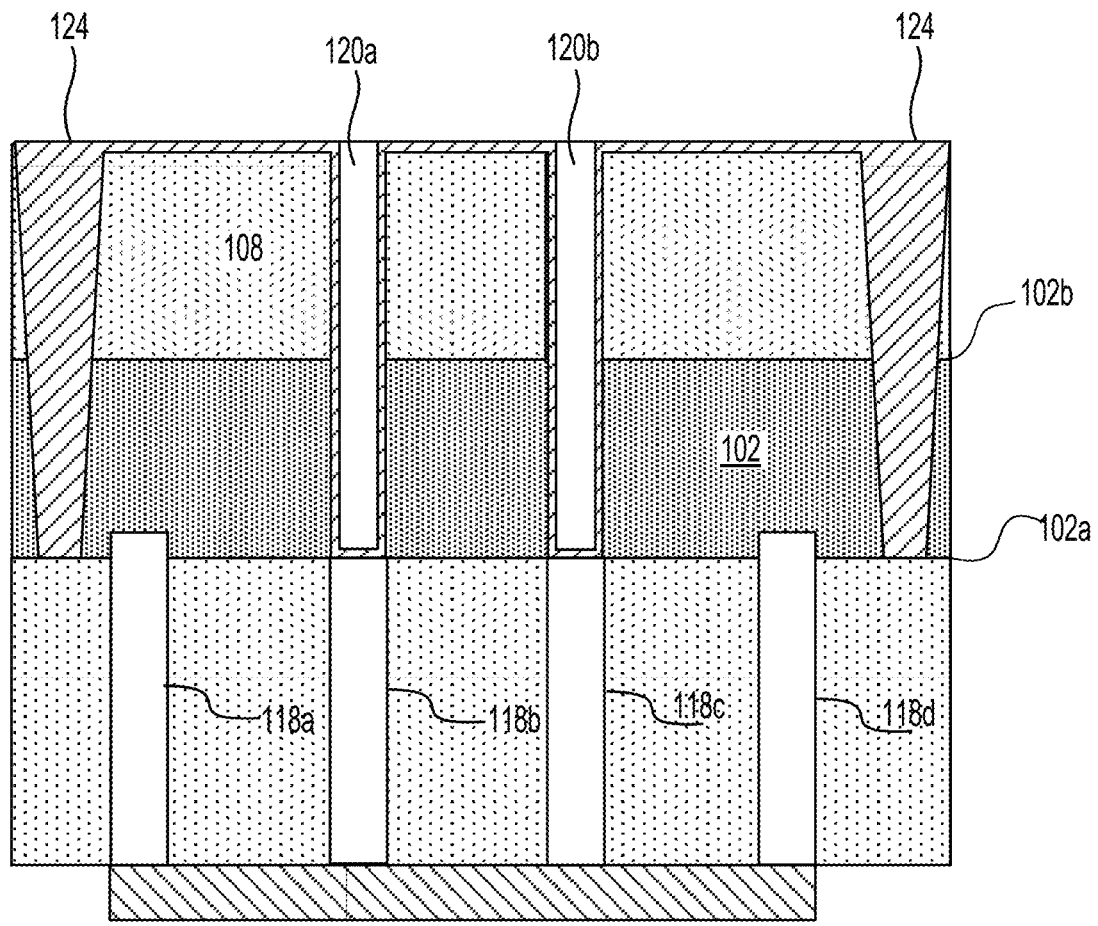

In FIG. 7, an insulating material 124 is formed to fill the trench opening 122 and the TSC openings 120. According to a microloading effect, a deposition rate can be higher in a feature with a low aspect ratio than in a feature with a high aspect ratio, where the aspect ratio is a ratio of a height to a width of the feature. Since the trench opening 122 has a smaller aspect ratio than the TSC openings 120, the insulating material 124 can have a higher deposition rate in the isolation trench 122. By precisely controlling the deposition time, the insulating material 124 can fully fill the trench opening 122. In the meanwhile, the insulating material 124 can form a conformal thin barrier layer along the side portions of the TSC openings. The insulating material 124 can further cover the exposed vias 118 at the bottom portions of the TSC openings 120 and further cover a top surface of the bottom dielectric layer 108. In another embodiment, the trench opening 122 can be filled with a first insulating material in a first deposition, and the TSC openings 120 can have a second insulating material to cover the side portions and the bottom portions in a second deposition. The insulating material 124 can include SiO, SiN, SiC, SiON, SiOC, SiCN, SiOCN, or Tetraethyl Orthosilicate (TEOS). In an embodiment of FIG. 7, the insulating layer 124 is TEOS.

Figure 8:
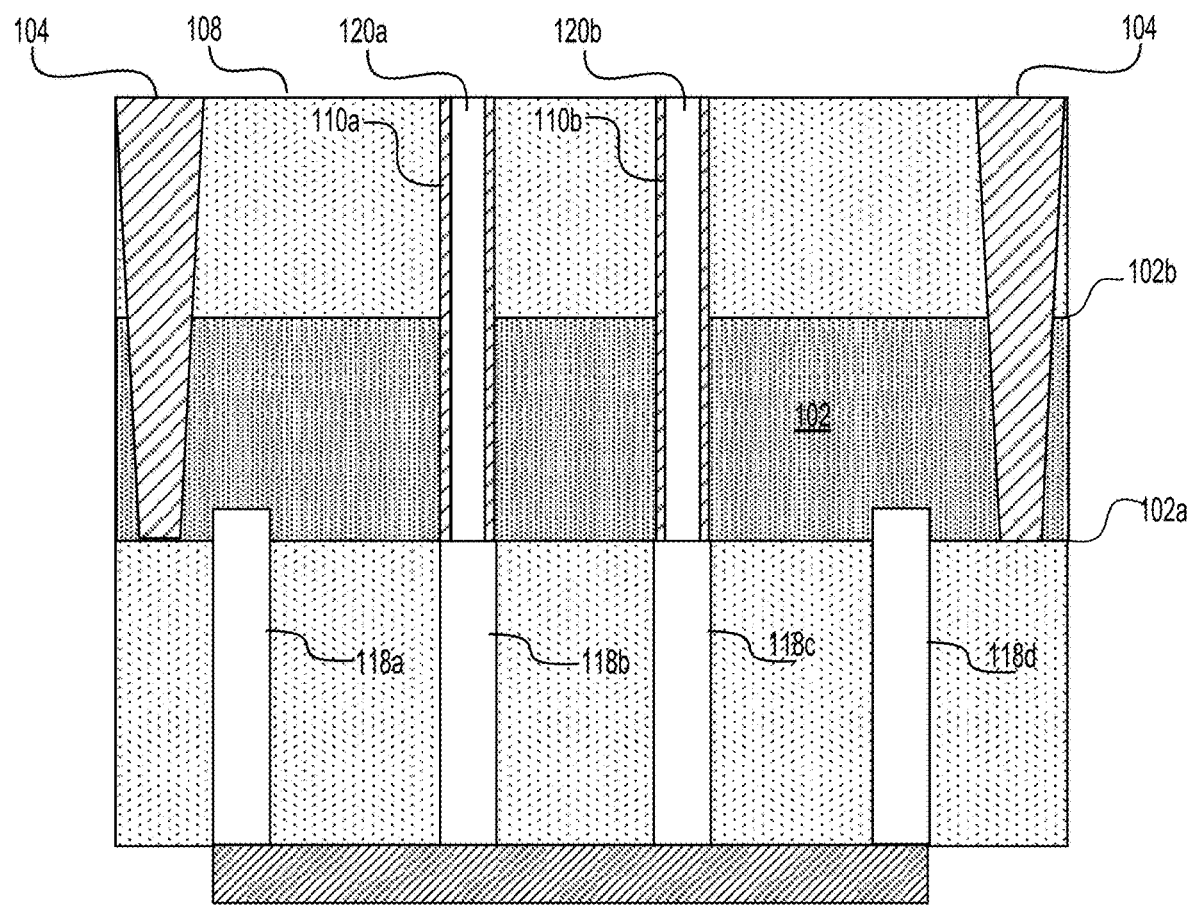

In FIG. 8, a removing process, such as an etching process, can be performed to remove the insulating layer at the bottom portions of the TSC openings 120 to expose the vias 118. In one example, the etching process may include blanket dry etching (e.g., blanket RIE or ICP etching). Blanket etching herein can mean an etching process without any protective mask. When the blanket etching is completed, the insulating material 124 formed at the bottom portions of the TSC openings 120, and the insulating material 124 formed over the bottom dielectric layer 108 can be removed. In addition, a top portion of the insulating material 124 in the trench opening 122 can also be removed. As shown in FIG. 8, after the removing process, the insulating material 124 that remains in the trench opening 122 forms the isolation trench 104. The insulating material 124 that remains along the side portions of the TSC openings 120 forms the barrier layers 110 in the TSC openings 120.

In some embodiments, as desired a mask could be applied to expose the bottom portions of the TSC openings 120 only. A dry etching can be applied afterwards. During the dry etching, a directional plasma or anisotropic plasma can be generated to remove the insulating layer 124 at the bottom portions of the TSC openings 120 to expose the vias 118. A subsequent surface planarization process can be performed to remove excessive insulating material 124 over the top surface of the bottom dielectric layer 108, such as an etching process or a CMP process.

Figure 9:
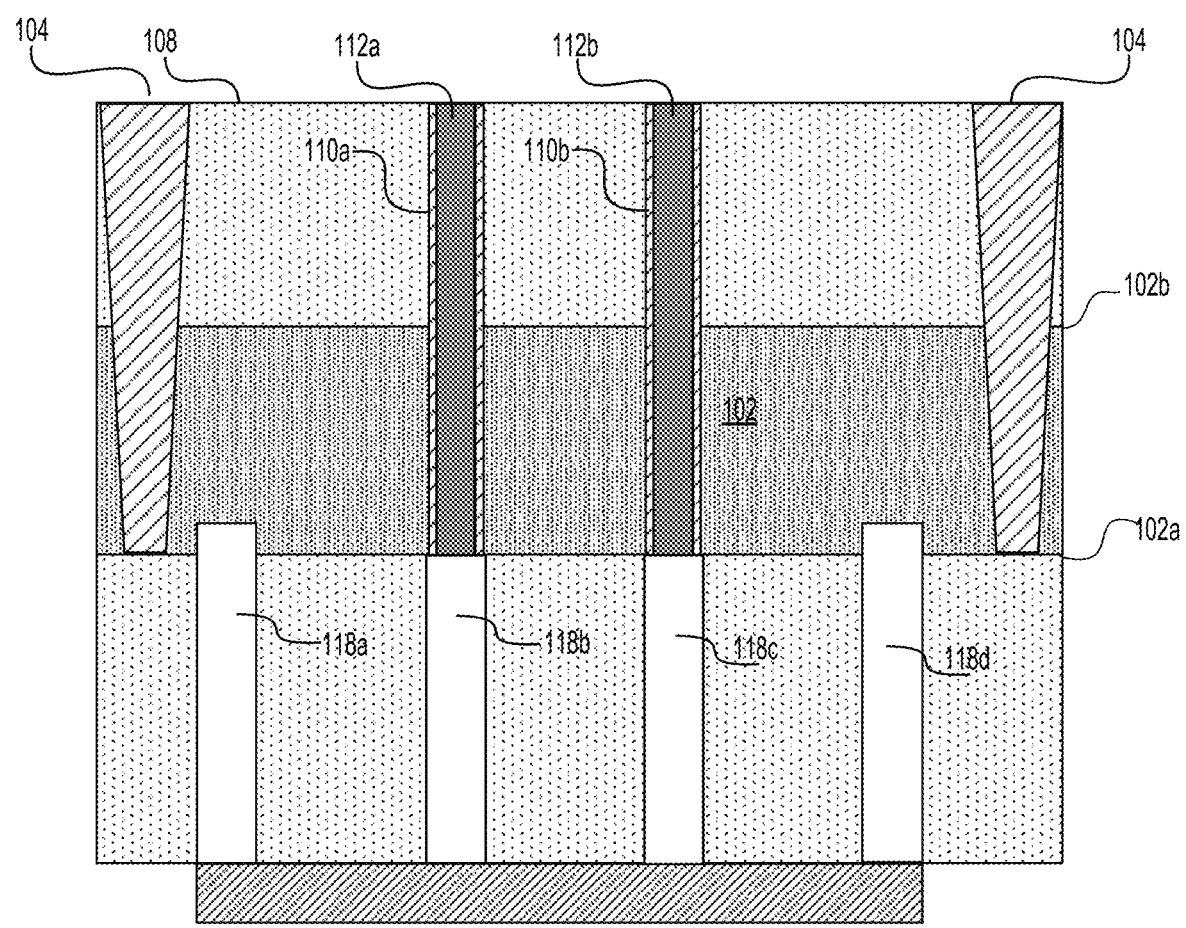

FIG. 9 illustrates the formation of the conductive layers 112 in the TSC openings 120. In an embodiment, the conductive layers 112 may include copper (Cu), copper magnesium (CuMn), copper aluminum (CuAl), and the like, and an electro-chemical plating (ECP) process may be applied. In some examples, a blocking layer (not shown in FIG. 9), such as Ti, TiN, Ta, TaN, or other suitable materials, is formed before the conductive layers 112. The barrier layer can be formed by using physical vapor deposition (PVD), CVD, ALD, or other well-known deposition techniques. In another embodiment, the conductive layers 112 may include cobalt (Co), tungsten (W), ruthenium (Ru), aluminum (Al), copper (Cu), or other suitable conductors, and be deposited by a suitable deposition process, such as chemical vapor deposition (CVD), physical vapor deposition (PVD), atomic layer deposition (ALD), sputtering, e-beam evaporation, or any combination thereof. In some embodiments, a subsequent surface planarization process, such as an etching process or a CMP process, can be applied to remove excessive conductive layers 112 over the top surface of the bottom dielectric layer 108.

Figure 10A:
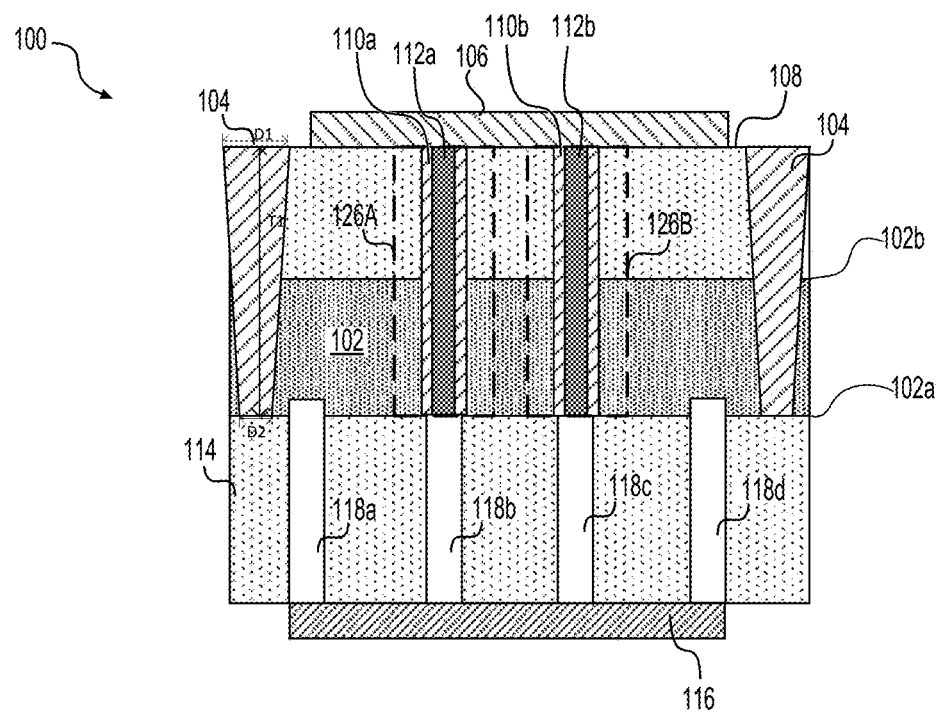
Figure 10B:
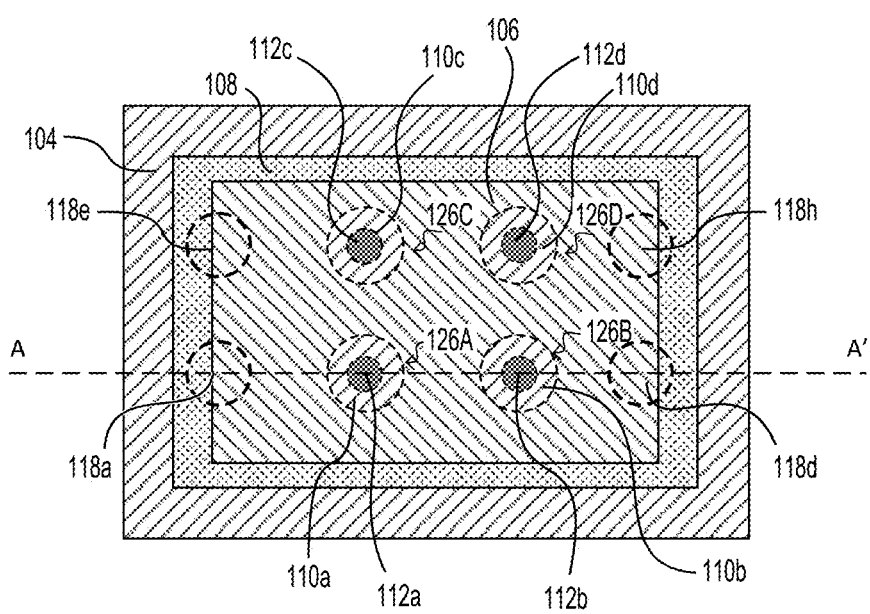

In FIGS. 10A/10B, a conductive plate 106 can be formed over the bottom dielectric layer 108. The conductive plate 106 can have a rectangle profile, a square profile, or other geometric profile. The conductive plate 106 can be made of aluminum or copper. The conductive plate 106 is connected with the TSCs 126 and functions as a bond pad during a packaging process. In some embodiments, the conductive plate 106 can be formed through a combination of a deposition process and an etching process. For example, a metal layer (e.g., Cu or Al) can be deposited over the bottom dielectric 108 through a CVD process, a PVD process, or a sputter process. A patterned mask can be subsequently formed over the metal layer, and an etching process can be applied to etch the metal layer. A portion of the metal layer that is protected by the patterned mask forms the conductive plate 106. In another embodiment, the conductive plate 106 can be formed through a combination of a photolithographic process and a deposition process. For example, a patterned mask can be formed over the bottom dielectric layer 108, and a metal layer can be formed preferably on an exposed region by the photolithographic process.

As shown in FIGS. 10A/10B, a complete TSC structure 100 is formed when the conductive plate 106 is introduced. The TSC structure 100 illustrated in FIGS. 10A/10B is identical to the TSC structure 100 illustrated in FIGS. 1A/1B.

Figure 11A:
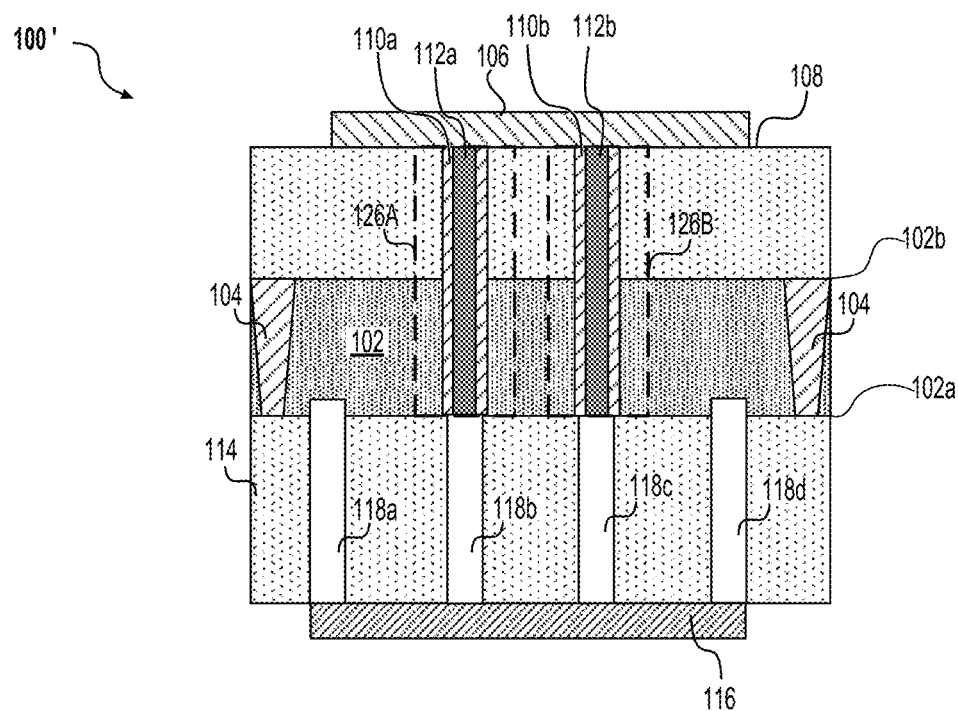
FIG. 11A is a cross-sectional view of an alternative TSC structure, in accordance with exemplary embodiments of the disclosure.
Figure 11B:
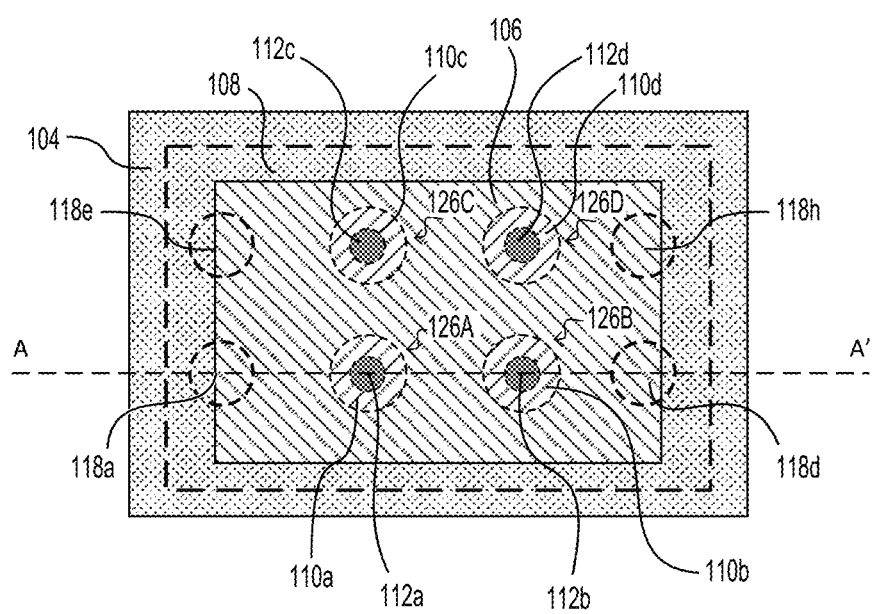
FIG. 11B is a top down view of the alternative TSC structure, in accordance with exemplary embodiments of the disclosure.

FIGS. 11A/11B are cross-sectional and top down views of an alternative through silicon contact (TSC) structure 100'. Comparing to TSC structure 100 illustrated in FIGS. 1 and 10, the isolation trench 104 formed in the TSC structure 100' has a different configuration. As shown in FIGS. 11A/11B, the isolation trench 104 is disposed between the first and second dielectric layers, and extends from the top surface 102a to the bottom surface 102b of the substrate 102.

Figure 12:
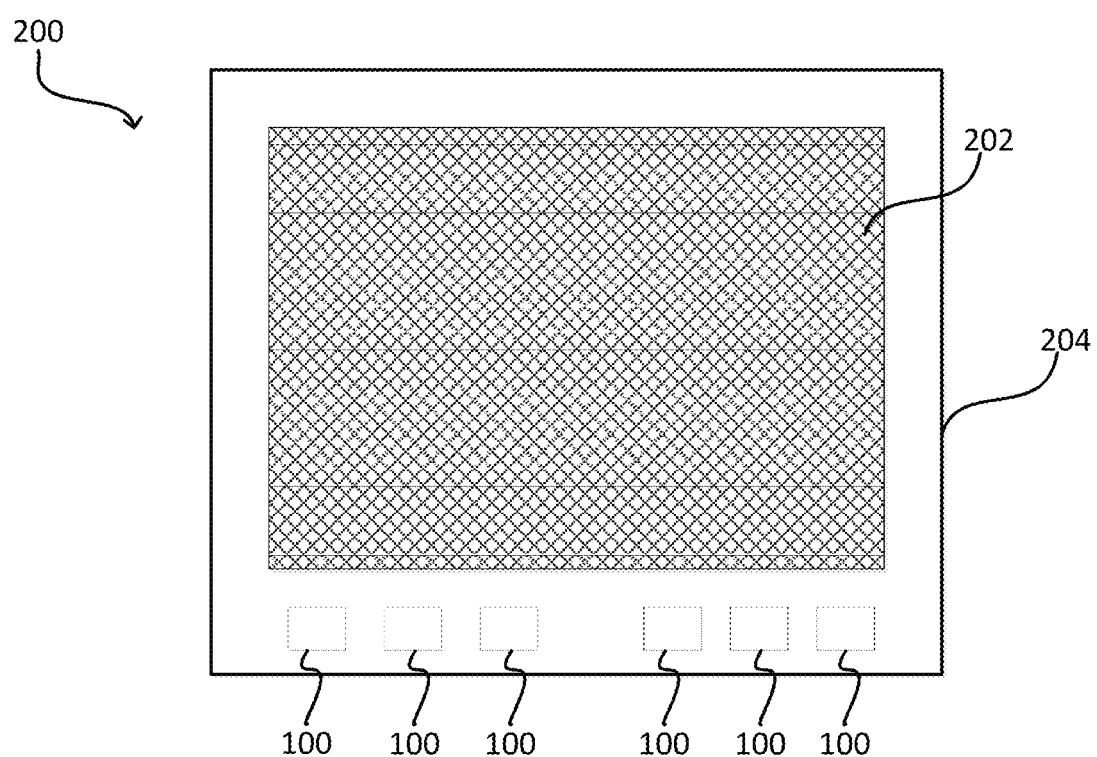
FIG. 12 is an integrated circuit chip, in accordance with exemplary embodiments of the disclosure.

FIG. 12 illustrates an integrated circuit chip 200 in accordance with an embodiment of the disclosure. The integrated circuit chip 200 has a chip boundary 204 and a memory cell region 202. The memory cell region 202 can include a plurality of memory cells, such as DRAM memory cells, NAND memory cells, three dimensional (3D)-NAND memory cells, phase change memory cells, or magnetoresistive random-access memory (MRAM) cells. The integrated circuit chip 200 further includes one or more TSC structures 100 that are adjacent to the memory cell region 202. The TSC structures are identical to the TSC structure 100 illustrated in FIGS. 1 and 10. Each of the TSC structures 100 and the memory cell region 202 are separated by the respective insulation trench 104 to prevent electrical interference.

Figure 13:
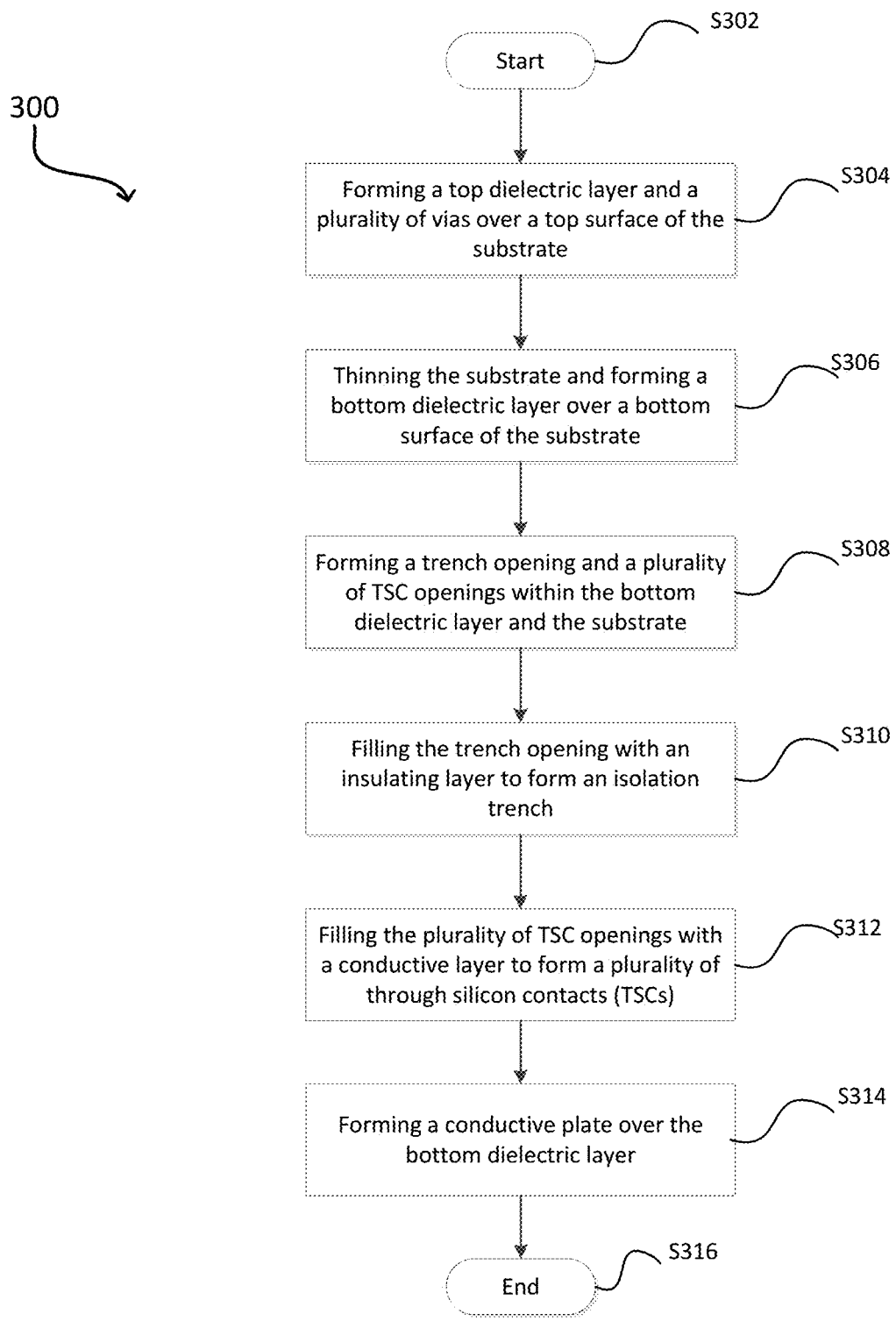
FIG. 13 is a flowchart of a process for manufacturing a TSC structure, in accordance with exemplary embodiments of the disclosure.

FIG. 13 is a flowchart of a process 300 for manufacturing a TSC structure in accordance with exemplary embodiments of the disclosure. The process 300 begins at step 304 where a top dielectric layer is formed over a top surface of a substrate, and a plurality of vias are formed in the top dielectric layer. The vias further extend into the substrate with a depth between 10 nm and 20 nm. A metal line is further formed to connect the vias. In some embodiments, step 304 can be performed as illustrated with reference to FIG. 3.

The process 300 then proceeds to step 306 where a bottom portion of the substrate is thinned down from a bottom surface and a bottom dielectric layer is formed over the bottom surface. The bottom dielectric layer can include SiO, SiN, SiC, SiON, SiOC, SiCN, SiOCN, AlO, AlON, ZrO, or high K material. The bottom dielectric layer can have a thickness in a range from 1 um to 2 um. In some embodiment, step 306 can be performed as illustrated with reference to FIGS. 4-5.

In step 308 of the process 300, a trench opening and a plurality of TSC openings can be formed in the bottom dielectric layer and the substrate. The trench opening and the TSC openings can be formed through a combination of a photolithographic process and an etching process. The trench opening passes through the bottom dielectric and substrate to expose the top dielectric layer. The trench opening is ring-shaped and concentrically surrounds the TSC openings. The TSC openings can have a circular pillar-shape. Each of the TSC openings has side portions and a bottom portion that exposes a respective via that is formed in the top dielectric. In some embodiments, the etching process can remove a portion of the via that extends into the substrate, and the TSC openings can therefore extend from the bottom surface to the top surface of the substrate. In some embodiment, step 308 can be performed as illustrated with reference to FIG. 6.

The process 300 then proceeds to step 310 where an insulating material is formed to fill the trench opening to form an isolation trench. The insulation material can also form a conformal thin barrier layer along side portions of the TSC openings. The insulating material further is formed at the bottom portions of the TSC openings and covers the exposed vias by the TSC openings. In some embodiment, step 310 can be performed as illustrated with reference to FIG. 7.

In step 312 of the process 300, a conductive layer is formed in each of the TSC openings. Prior to the formation of the conductive layer, an etching process is applied to remove the insulating material formed at the bottom portions of the TSC openings to expose the vias. The conductive layer may include copper (Cu), copper magnesium (CuMn), copper aluminum (CuAl), and the like, and an electrochemical plating (ECP) process may be applied. In some examples, a blocking layer (not shown in FIG. 9), such as Ti, TiN, Ta, TaN, or other suitable materials, is formed before the conductive layers. A subsequent surface planarization process, such as CMP, can be applied to remove excessive conductive layer over the bottom dielectric layer. In some embodiment, step 312 can be performed as illustrated with reference to FIGS. 8-9.

The process 300 then proceeds to step 314 where a conductive plate is formed over the bottom dielectric layer. The conductive plate can have a rectangle profile, a square profile, or other geometric profile. The conductive plate can be made of aluminum or copper. The conductive plate is connected with the TSCs and functions as a bond pad during a packaging process. In some embodiments, the conductive plate can be formed through a combination of a deposition process and an etching process. In some embodiment, step 314 can be performed as illustrated with reference to FIGS. 10A/10B.

It should be noted that additional steps can be provided before, during, and after the process 300, and some of the steps described can be replaced, eliminated, or performed in different order for additional embodiments of the process 300. In subsequent process steps, various additional interconnect structures (e.g., metallization layers having conductive lines and/or vias) may be formed over the semiconductor device 100. Such interconnect structures electrically connect the semiconductor device 100 with other contact structures and/or active devices to form functional circuits.

Additional device features such as passivation layers, input/output structures, and the like may also be formed.

The various embodiments described herein offer several advantages over related examples. For example, in a related TSC structure, parasitic capacitance can be formed between the substrate and the related TSC structure due to the electric potential difference. The formed parasitic capacitance in turns causes RC delay during the operation of the integrated circuit chip that is electrically coupled with the related TSC structure. The disclosed TSC structure introduces one or more vias that are electrically coupled with the plurality of through silicon contacts (TSCs) and the substrate to reduce/eliminate the electric potential difference between the TSCs and the substrate. The reduced/eliminated electric potential difference in turn reduces or eliminates parasitic capacitance formed between the TSCs and the substrate. In addition, an isolation trench is introduced into the disclosed TSC structure that separates the disclosed TSC structure from adjacent electronic components to prevent the electrical interference between the disclosed TSC structure and the adjacent electronic components.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an integrated structure, comprising:
    forming a top dielectric layer over a top surface of a substrate;
    forming a plurality of vias through the top dielectric layer that extend into the substrate, the plurality of vias being electrically coupled to one another;
    forming a bottom dielectric layer on a bottom surface of the substrate;
    forming an isolation opening and a plurality of contact openings in the bottom dielectric layer and the substrate, the isolation opening passing through the bottom dielectric layer and extending from the bottom surface to the top surface of the substrate, each of the plurality of contact openings having side portions and a bottom portion to expose a respective via of the plurality of vias that is formed in the top dielectric layer;
    filling the isolation opening with an insulating layer to form an isolation trench;
    filling the plurality of contact openings with a conductive layer to form a plurality of through silicon contacts (TSCs), the conductive layer being in contact with the respective via that is exposed by each of the plurality of contact openings; and
    forming a conductive plate over the bottom dielectric layer, the conductive plate being in contact with the plurality of TSCs, the conductive plate being surrounded by the isolation trench and spaced apart from the isolation trench.

2. The method of claim 1, wherein the forming the bottom dielectric layer over the bottom surface of the substrate further comprises:

removing a bottom portion of the substrate from the bottom surface; and forming the bottom dielectric layer over the bottom surface of the substrate.

3. The method of claim 1, wherein the filling the plurality of contact openings with the conductive layer further comprises:

forming a barrier layer along the side portions of each of the plurality of contact openings, the barrier layer further being formed over the respective via that is exposed by each of the plurality of contact openings;

removing the barrier layer formed over the respective via;

depositing the conductive layer in each of the plurality of contact openings, the conductive layer being formed along the barrier layer and in contact with the respective via that is exposed by each of the plurality of contact openings, the conductive layer further covering the bottom dielectric layer; and performing a surface planarization process to remove the conductive layer over the bottom dielectric layer.

4. The method of claim 1, wherein the filling the plurality of contact openings with the conductive layer further comprises:

filling the isolation opening and the plurality of contact openings with the insulating layer, the insulating layer being formed along the side portions of each of the plurality of contact openings, the insulating layer being formed over the respective via that is exposed by each of the plurality of contact openings, and the insulating layer further being formed over the bottom dielectric layer;

removing the insulating layer formed over the respective via that is exposed by each of the plurality of contact openings, and removing the insulating layer formed over the bottom dielectric layer;

depositing the conductive layer in each of the plurality of contact openings, the conductive layer being formed along the insulating layer and in contact with the respective via that is exposed by each of the plurality of contact openings, the conductive layer further covering the bottom dielectric layer; and performing a surface planarization process to remove the conductive layer over the bottom dielectric layer.

5. The method of claim 1, wherein at least one via of the plurality of vias formed in the top dielectric layer is electrically coupled with the substrate by extending into the substrate and is not exposed by the contact openings.

6. The method of claim 1, wherein the forming the isolation opening comprises forming the isolation opening with a closed-loop configuration that surrounds the plurality of contact openings.

7. The method of claim 1, further comprising:

forming a metal line over the top dielectric layer, the metal line being in contact with the plurality of vias.

8. The method of claim 1, wherein the isolation opening comprises a tapered profile in the bottom dielectric layer and the substrate.

9. The method of claim 8, wherein the isolation opening has a first critical dimension (CD) at the bottom surface, and a second CD at the top surface, the first CD being larger than the second CD.

10. The method of claim 1, wherein each of the plurality of vias has a pillar-shape in the top dielectric layer.

11. A method for forming an integrated structure, comprising:

forming a top dielectric layer over a top surface of a substrate;

forming a plurality of first vias and a plurality of second vias in the top dielectric layer, the plurality of first vias and the plurality of second vias further extending into the substrate from the top surface;

forming a bottom dielectric layer over a bottom surface of the substrate;

forming a plurality of contact openings in the bottom dielectric layer and the substrate, each of the plurality of contact openings having side portions and a bottom portion to expose a respective second via of the plurality of second vias; and filling the plurality of contact openings with a conductive layer to form a plurality of through silicon contacts (TSCs) so that each of the plurality of TSCs is in contact with a respective second via of the plurality of second vias, wherein:

the plurality of first vias are electrically coupled to the substrate, and the plurality of second vias are electrically coupled to the plurality of TSCs.

12. The method of claim 11, further comprising:

forming a metal line over the top dielectric layer, the metal line being in contact with the plurality of first vias and the plurality of second vias so that the plurality of first vias and the plurality of second vias are coupled to each other.

13. The method of claim 12, further comprising:

forming a conductive plate over the bottom dielectric layer, the conductive plate being in contact with the plurality of TSCs.

14. The method of claim 13, further comprising:

forming an isolation opening in the bottom dielectric layer and the substrate, the isolation opening passing through the bottom dielectric layer and extending from the bottom surface to the top surface of the substrate, the isolation opening having a tapered profile in the bottom dielectric layer and the substrate, the isolation opening having a closed-loop configuration that surrounds the plurality of contact openings.

15. The method of claim 11, wherein the forming the bottom dielectric layer over the bottom surface of the substrate further comprises:

removing a bottom portion of the substrate from the bottom surface; and forming the bottom dielectric layer over the bottom surface of the substrate.

16. The method of claim 13, wherein the filling the plurality of contact openings with the conductive layer further comprises:

forming a barrier layer along the side portions of each of the plurality of contact openings, the barrier layer further being formed over the respective second via that is exposed by each of the plurality of contact openings;

removing the barrier layer formed over the respective second via;

depositing the conductive layer in each of the plurality of contact openings, the conductive layer being formed along the barrier layer and in contact with the respective second via that is exposed by each of the plurality of contact openings, the conductive layer further covering the bottom dielectric layer; and performing a surface planarization process to remove the conductive layer over the bottom dielectric layer.

17. The method of claim 14, wherein the filling the plurality of contact openings with the conductive layer further comprises:
- filling the isolation opening and the plurality of contact openings with an insulating layer, the isolation opening being filled with the insulating layer to form an isolation trench, the insulating layer being formed along the side portions of each of the plurality of contact openings, the insulating layer being formed over the respective second via that is exposed by each of the plurality of contact openings, and the insulating layer further being formed over the bottom dielectric layer;
- removing the insulating layer formed over the respective second via that is exposed by each of the plurality of contact openings, and removing the insulating layer formed over the bottom dielectric layer;
- depositing the conductive layer in each of the plurality of contact openings, the conductive layer being formed along the insulating layer and in contact with the respective second via that is exposed by each of the plurality of contact openings, the conductive layer further covering the bottom dielectric layer; and
- performing a planarization process to remove the conductive layer over the bottom dielectric layer.

18. The method of claim 11, wherein the plurality of first vias and the plurality of second vias have a pillar-shape in the top dielectric layer.

19. The method of claim 14, wherein the isolation opening has a first critical dimension (CD) at the bottom surface, and a second CD at the top surface, the first CD being larger than the second CD.

20. The method of claim 17, wherein the isolation trench has a closed-loop configuration to surround the conductive plate and the plurality of TSCs, the isolation trench and the conductive plate being spaced apart from each other.

* * * * *